(12) United States Patent
Fang (10) Patent No.: US 9,721,806 B2
(45) Date of Patent: Aug. 1, 2017

(54) LDMOS DEVICE AND FABRICATION METHOD THEREOF

(71) Applicant: Semiconductor Manufacturing International (Shanghai) Corporation, Shanghai (CN)

(72) Inventor: Lei Fang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/053,001

(22) Filed: Feb. 25, 2016

(65) Prior Publication Data

US 2016/0276476 A1   Sep. 22, 2016

(30) Foreign Application Priority Data

Mar. 20, 2015   (CN) .......................... 2015 1 0125915

(51) Int. Cl.
*H01L 29/78* (2006.01)
*H01L 29/06* (2006.01)
*H01L 21/311* (2006.01)
*H01L 29/423* (2006.01)
*H01L 29/66* (2006.01)
*H01L 21/762* (2006.01)
*H01L 29/10* (2006.01)

(52) U.S. Cl.
CPC .. *H01L 21/31116* (2013.01); *H01L 21/76229* (2013.01); *H01L 29/0653* (2013.01); *H01L 29/4236* (2013.01); *H01L 29/66621* (2013.01); *H01L 29/66659* (2013.01); *H01L 29/7835* (2013.01); *H01L 29/1095* (2013.01); *H01L 29/42368* (2013.01)

(58) Field of Classification Search
CPC ............. H01L 29/4236; H01L 29/0653; H01L 29/7835; H01L 29/42368; H01L 29/42376; H01L 29/66659; H01L 29/66704; H01L 29/7825
USPC .......................... 257/330, 339, E29.256, 334
See application file for complete search history.

(56) References Cited

U.S. PATENT DOCUMENTS

2009/0256212 A1* 10/2009 Denison .............. H01L 29/0653
257/408
2009/0283825 A1* 11/2009 Wang .................... H01L 29/407
257/335
2014/0042527 A1*  2/2014 Lee ...................... H01L 29/4236
257/330

(Continued)

*Primary Examiner* — David Vu
*Assistant Examiner* — Jonathan Han
(74) *Attorney, Agent, or Firm* — Anova Law Group, PLLC (57) ABSTRACT

The disclosed subject matter provides an LDMOS device and fabrication method thereof. In an LDMOS device, a drift region and a body region are formed in a substrate. A first trench is formed in the drift region and in the substrate between the drift region and the body region. The first trench is separated from the drift region by a first shallow trench isolation structure. A gate dielectric layer is formed on a side surface and a bottom surface of the first trench. A gate electrode filling up the first trench is formed on the gate dielectric layer with a top surface above a top surface of the semiconductor substrate. A source region is formed in the body region on one side of the gate electrode and a drain region is formed in the drift region on another side of the gate electrode.

17 Claims, 3 Drawing Sheets

(56) References Cited

U.S. PATENT DOCUMENTS

2015/0155379 A1\* 6/2015 Kumar ................ H01L 29/7813
　　　　　　　　　　　　　　　　　　　　257/330
2016/0111488 A1\* 4/2016 Lu ....................... H01L 29/7825
　　　　　　　　　　　　　　　　　　　　257/330

\* cited by examiner

LDMOS DEVICE AND FABRICATION METHOD THEREOF

CROSS-REFERENCES TO RELATED APPLICATIONS

This application claims the priority of Chinese Patent Application No. CN201510125915.X, filed on Mar. 20, 2015, the entire content of which is incorporated herein by reference.

FIELD OF THE DISCLOSURE

The present disclosure generally relates to the field of semiconductor fabrication technology and, more particularly, relates to LDMOS devices and fabrication methods thereof.

BACKGROUND

Power field-effect transistors primarily include two different types, namely, vertical double-diffused MOSFET (VDMOS) and lateral double-diffused MOSFET (LDMOS). Compared to the VDMOS, LDMOS demonstrates a number of advantages. For example, the latter has better thermal stability and frequency stability, better gain and durability, lower feedback capacitance and thermal resistance, as well as a constant input impedance and a simpler bias circuit.

Figure 1:
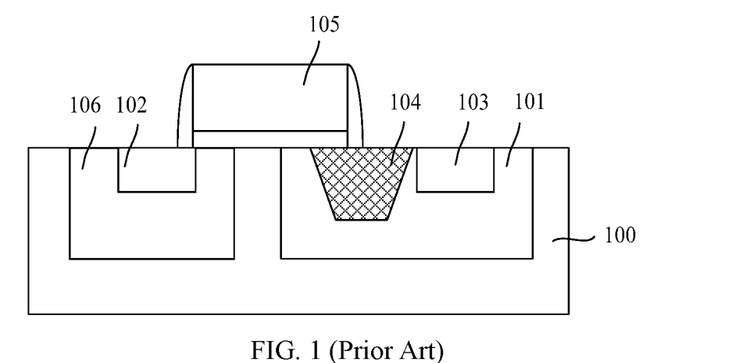
FIG. 1 illustrates a schematic view of a conventionally fabricated LDMOS device structure.

FIG. 1 shows a conventional N-type LDMOS device structure. The N-type LDMOS device structure includes a semiconductor substrate (not shown), a P-type well 100 formed in the semiconductor substrate, an N-type drift region 101 formed in the P-type well 100, a shallow trench isolation structure 104 formed in the N-type drift region 101. The shallow trench isolation structure 104 is used to increase the conduction path in the LDMOS device, to thus further increase the breakdown voltage of the device.

The N-type LDMOS device structure shown in FIG. 1 further includes a P-type body region 106 formed inside of the P-type well 100 on the side of the N-type drift region 101. A gate structure 105 is formed on the surface of the semiconductor substrate. The gate structure 105 is formed to across the P-type body region 106 and the N-type drift region 101 with a portion of the gate structure 105 located on the top of the shallow trench isolation structure 104. The gate structure 105 further includes a gate dielectric layer formed on the semiconductor substrate, a gate electrode formed on the top of the gate dielectric layer, and sidewalls formed on both sides of the gate dielectric layer and the gate electrode layer. A source region 102 is formed in the P-type body region 106 on one side of the gate structure 105 and a drain region 103 is formed in the N-type of drift area 101 on the other side of the gate structure 105. Both the source region 102 and the drain region 103 are doped with N-type dopant.

However, conventionally-fabricated LDMOS devices still have a very large size, which prevents further improvement of the degree of integration. The disclosed fabrication method and device structure are directed to decreasing the size of the LDMOS devices to solve one or more problems set forth above and other problems in the art.

BRIEF SUMMARY OF THE DISCLOSURE

One aspect of the present disclosure includes a method for fabricating a lateral double-diffused MOSFET (LDMOS) device. The method includes forming a drift region and a body region in a semiconductor substrate, forming a first shallow trench isolation structure in the drift region and in the semiconductor substrate between the drift region and the body region, removing a portion of the first shallow trench isolation structure to provide a first trench having a first portion in the semiconductor substrate between the drift region and the body region and a second portion in the drift region next to a remaining portion of the first shallow trench isolation structure, forming a gate dielectric layer on a side surface and a bottom surface of the first trench, forming a gate electrode on the gate dielectric layer and filling up the first trench to provide a top surface above a top surface of the semiconductor substrate, and forming a source region in the body region on one side of the gate electrode and a drain region in the drift region on another side of the gate electrode.

Another aspect of the present disclosure provides an LDMOS device. The LDMOS device includes a semiconductor substrate, a drift region and a body region formed in the semiconductor substrate, a first shallow trench isolation structure formed in the drift region, and a gate dielectric layer disposed on a side surface and a bottom surface of a first trench. The first trench is positioned to have a first portion in the drift region next to the first shallow trench isolation structure and a second portion in the semiconductor substrate between the drift region and the body region. The LDMOS device also includes a gate electrode formed on the gate dielectric layer, filling up the first trench, and having a top surface above a top surface of the semiconductor substrate, a source region formed in the body region on one side of the gate electrode, and a drain region in the drift region formed on another side of the gate electrode.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In conventional LDMOS devices, the length of the conduction path may be increased by forming a shallow trench isolation structure in the drift region. The breakdown voltage may therefore be increased. However, because the conduction path formed in the semiconductor substrate under the gate electrode is along a horizontal direction while both the gate electrode and the shallow trench isolation structure may have to occupy a certain width along the horizontal direction, the entire LDMOS device may have a substantial dimension on the semiconductor substrate along the horizontal direction. This prevents increasing of the degree of integration of the devices.

Figure 6:
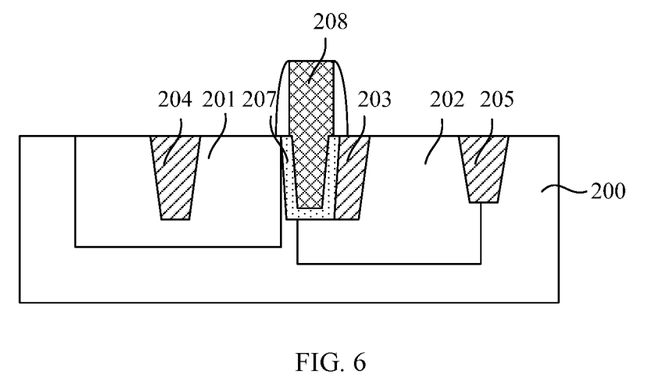
Figure 7:
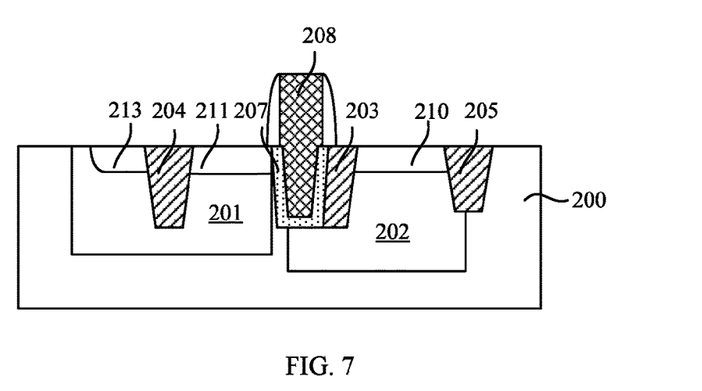
Figure 8:
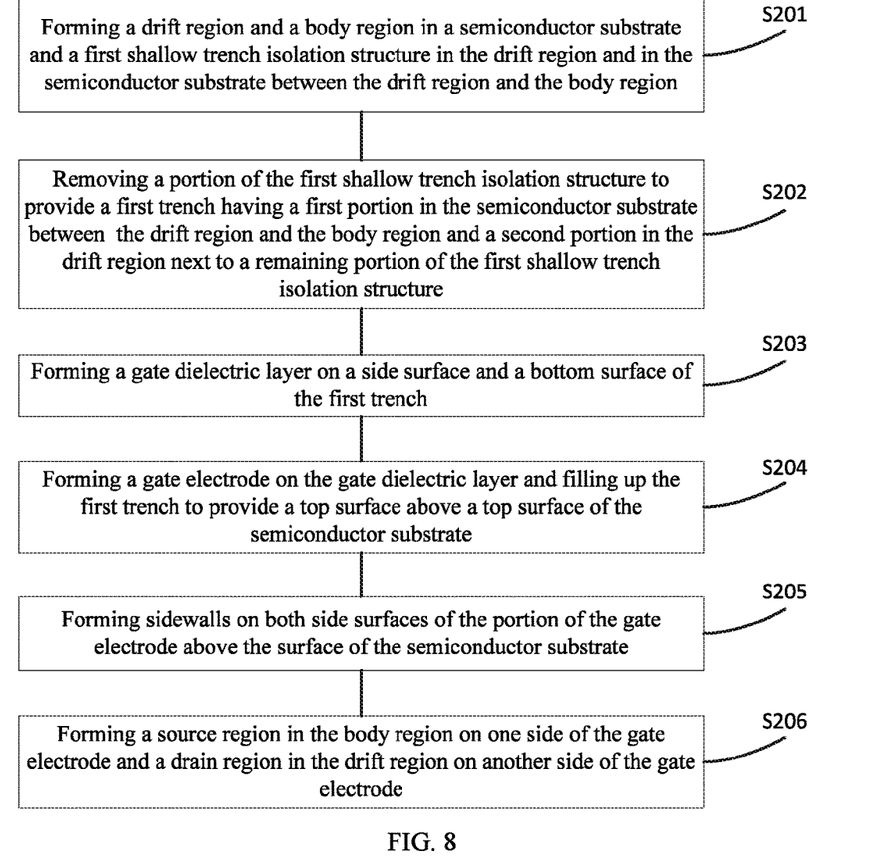
FIG. 8 illustrates a flowchart of an exemplary fabrication process consistent with disclosed embodiments.

The present disclosure provides a method for fabricating LDMOS devices. FIG. 8 shows a schematic flowchart of the disclosed fabrication method consistent with various embodiments of the present disclosure. FIGS. 2-7 shows schematic views of semiconductor structures corresponding to certain stages of the disclosed fabrication method.

Figure 2:
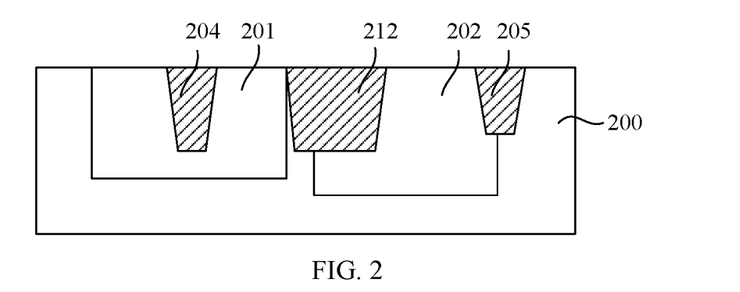
FIGS. 2-7 illustrate schematic views of semiconductor structures corresponding to certain stages of an exemplary fabrication method consistent with disclosed embodiments.

Referring to FIG. 8, at the beginning of the fabrication process, a semiconductor substrate may be provided (S201). FIG. 2 shows a schematic cross-section view of the semiconductor substrate 200.

Referring to FIG. 2, the semiconductor substrate 200 is provided. A drift region 202 may be formed in the semiconductor substrate 200. A body region 201 may also be formed in the semiconductor substrate 200 on one side of the drift region 202. Further, a first shallow trench isolation structure 212 may be formed in the drift region 202 and also in a region of the semiconductor substrate 200 between the drift region 202 and the body region 201.

The semiconductor substrate 200 may be used as a platform for further formation of an LDMOS device. The semiconductor substrate 200 may be made of one of Si, Ge, GeSi, SiC, silicon on insulator, and germanium on insulator. The semiconductor substrate 200 may also be made of any other appropriate materials such as GaAs and other Group III-V compounds, etc. In one embodiment, the semiconductor substrate 200 is made of Si.

The semiconductor substrate 200 may be doped with impurity ions with a first conductivity-type. The first conductivity-type impurity ions may be P-type impurity ions or N-type impurity ions. The conductivity-type of the impurity ions to be doped in may be selected based on the type of the LDMOS device to be fabricated. Specifically, when the LDMOS device to be fabricated is an N-type LDMOS device, the first conductivity-type impurity ions may be N-type impurity ions; while when the LDMOS device to be fabricated is a P-type LDMOS device, the first conductivity-type impurity ions may then be P-type impurity ions.

The P-type impurity ions may be one or more of boron ions, indium ions, and gallium ions. The N-type impurity ions may be one or more of phosphorus ions, arsenic ions, and antimony ions. In one embodiment, the LDMOS device to be fabricated is an N-type LDMOS device and N-type impurity ions may be doped into the semiconductor substrate 200 by an ion implantation process.

The first shallow trench isolation structure 212 may be formed in the semiconductor substrate 200. A portion of the first shallow trench isolation structure 212 is located in the drift region 202. Another portion of the first shallow trench isolation structure 212 is located in the region of the semiconductor substrate 200 between the drift region 202 and the body region 201. In a subsequent process, the entire portion of the first shallow trench isolation structure 212 located between the drift region 202 and the body region 201 as well as a portion of the first shallow trench isolation structure 212 in the drift region 202 may be removed by etching to form a first trench 206 (shown in FIG. 3), so that the position of the first trench 206 may be precisely defined. The remaining portion of the first shallow trench isolation structure 212 in the drift region 202 after the subsequent etching process may then be used to increase the conduction path in the LDMOS device.

In one embodiment, the width of the first shallow trench isolation structure 212 gradually decreases from the top to the bottom. The top edge of first shallow trench isolation structure 212 is in contact with the top edge of the body region 201. During a subsequent process to form the first trench 206 by removing a portion of the first shallow trench isolation structure 212 through etching, a side surface of the first trench may be connected to the surface of the top edge of the body region 201 and the surface of a portion of the semiconductor substrate 200 between the drift region 202 and the body region 201. That is, the first trench may expose the surface of the top edge of the body region 201 and the surface of the portion of the semiconductor substrate between the drift region 202 and the body region 201. Therefore, after further forming a gate dielectric layer and a gate electrode, when the formed LDMOS device is at work, a conductive channel may be formed along the side surface of the first trench in the semiconductor substrate 200 between the body region 201 and the drift region 202.

In one embodiment, the width of the first shallow trench isolation structure 212 may be in a range of about 0.4 µm to about 0.8 µm. The depth of the first shallow trench isolation structure 212 may be in a range of about 0.4 µm to about 1.8 µm. The first shallow trench isolation structure 212 may be made of one or more of SiO, SiN, SiON, etc.

The first shallow trench isolation structure 212 may be fabricated by a process including: forming a patterned mask layer on the semiconductor substrate 200; forming a trench by etching the semiconductor substrate 200 using the patterned mask layer as an etch mask; forming the first shallow trench isolation structure 212 by filling the first trench with an isolation material; and removing the patterned mask layer.

The first shallow trench isolation structure 212 may have a single-layer structure or a multiple-layer structure (e.g., having two or more layers). In one embodiment, the first shallow trench isolation structure 212 has a double-layer structure. Specifically, the double-layer structure includes a liner layer located on the surfaces of the sidewall and the bottom of the trench and a filling layer on the surface of the linear layer to fill up the trench to form the first shallow trench isolation structure 212.

As shown in FIG. 2, a second shallow trench isolation structure 205 may be formed in the semiconductor substrate 200. The second shallow trench isolation structure 205 may be used to electrically isolate a subsequently-formed drain region from an adjacent active region.

A third shallow trench isolation structure 204 may also be formed in the body region 201 of the semiconductor substrate 200. The third shallow trench isolation structure 204 may be used to electrically isolate a subsequently-formed source region from a subsequently-formed adjacent first doped region.

The second shallow trench isolation structure 205 and/or the third shallow trench isolation structure 204 may or may not be formed by a same fabrication process as the first shallow trench isolation structure 212 is formed.

The body region 201 and the drift region 202 may be formed by ion implantation. The type of the ions doped into the body region 201 is different from the type of the ions doped into the drift region 202. Specifically, when the LDMOS device to be fabricated is an N-type LDMOS device, the ions doped into the body region 201 are P-type and the ions doped into the drift region 202 are N-type; when the LDMOS device to be fabricated is a P-type LDMOS device, the ions doped into the body region 201 are N-type and the ions doped into the drift region 202 are P-type.

A portion of the subsequently-formed first trench may be located in the drift region 202 and as a result, a portion of a gate structure (including the gate dielectric layer and the gate electrode) formed in the first trench is also located in the drift region. Therefore, the vertical depth of the drift region 202 corresponding to the bottom of the gate structure may be reduced, thus the transport channel of the conduction current in the region may become narrow. In one embodiment, the depth of the drift region 202 is greater than the depth of the body region 201 so that the gate structure formed in the first trench may not affect the transport of the conduction current in the drift region 202 or may have relatively small influence on the conduction current.

The depth of the first shallow trench isolation structure 212 may be less than the depth of the drift region 202 as shown in FIG. 2.

A portion of the second shallow trench isolation structure 205 may be formed in the drift region 202 while the other portion of the second shallow trench isolation structure 205 may be formed in the semiconductor substrate 200 outside of the drift region 202. The depth of the second shallow trench isolation structure 205 may be less than the depth of the drift region 202.

The third shallow trench isolation structure 204 may be entirely formed in the body region 201. The depth of the third shallow trench isolation structure 204 may be less than the depth of the body region 201.

The body region 201 and/or the drift region 202 may be formed either before or after the formation of the first shallow trench isolation structure 212.

Figure 3:
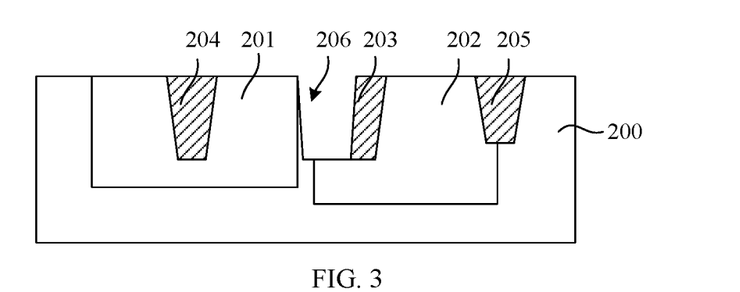

Further, returning to FIG. 8, the entire portion of the first shallow trench isolation structure formed in the semiconductor substrate between the drift region and the body region together with a portion of the first shallow trench isolation structure formed in the drift region may be removed (S202). FIG. 3 shows a corresponding semiconductor structure.

Referring to FIG. 3, the entire portion of the first shallow trench isolation structure 212 (referring to FIG. 2) formed in the semiconductor substrate 200 between the drift region 202 and the body region 201 is removed by an etching process. In the meantime, a portion of the first shallow trench isolation structure 212 formed in the drift region 202 is also removed during the etching process. That is, another portion of the first shallow trench isolation structure 212 formed in the drift region 202 on the far side from the body region 201 may still remain after the etching process. As such, a first trench 206 is formed in the drift region 202 next to the remaining first shallow trench isolation structure 203 and also in the semiconductor substrate 200 between the drift region 202 and the body region 201.

Prior to etching the portion of the first shallow trench isolation structure 212, the fabrication process may further include forming a patterned mask layer on the semiconductor substrate 200. The mask layer may expose the surface of the portion of the first shallow trench isolation structure 212 between the body region 201 and the drift region 202 as well as a portion of the surface of the first shallow trench isolation structure 212 formed in the drift region 202. That is, most of the surface of the first shallow trench isolation structure 212, except a portion of the surface of the first shallow trench isolation structure 212 on the far side from the body region 201, may be exposed by the patterned mask layer. After performing a subsequent etching process, the covered portion of the first shallow trench isolation structure 212 may remain to form the remaining first shallow trench isolation structure 203.

The entire portion of the first shallow trench isolation structure 212 (referring to FIG. 2) in the semiconductor substrate 200 between the drift region 202 and the body region 201 as well as the portion of the first shallow trench isolation structure 212 in the drift region 202 on the near side from the body region 201 may be removed, for example, by an anisotropic dry etching process. The dry etching process may be a plasma etching process. In one embodiment, the plasma etching process uses an etching gas including one or more gases containing carbon-fluorine such as $CF_4$, $C_2F_6$, $C_3F_8$, etc. During the etching process, the power of the source is in a range of about 550 W to about 1500 W, the offset power is in a range of about 100 W to about 300 W, the pressure in the etching chamber is in a range of about 2 mTorr to about 40 mTorr. The etching condition described above may improve the precision of the formed first trench 206 and also reduce damage to the semiconductor substrate exposed in the first trench 206 during the etching process.

In one embodiment, the first trench 206 is formed by removing a portion of the first shallow trench isolation structure 212 through etching. Because the first shallow trench isolation structure 212 is made of a material different from the material of the semiconductor substrate 200 and during the etching process, the ratio between the etching rate on the material of the first shallow trench isolation structure 212 and the etching rate on the material of the semiconductor substrate 200 is sufficiently large, the portion of the semiconductor substrate 200 in contact with the first shallow trench isolation structure 212 may serve as an etching stop layer. Therefore, the position precision of the formed first trench 206 may be improved and the difficulty of the process to form the first trench 206 may also be reduced.

In one embodiment, the depth of the first trench 206 may equal to the depth of the first shallow trench isolation structure 212.

The width of the formed first trench 206 may correspond to the width of the subsequently-formed gate structure (including a gate dielectric layer and a gate electrode formed on the gate dielectric layer). A vertical conductive channel may be formed in the semiconductor substrate 200 under the bottom of the gate structure. Therefore, with a same breakdown voltage, the width of the gate structure in the present disclosure may be smaller than the width of the gate structure in conventionally fabricated LDMOS devices. That is, the width of the formed first trench 206 may be smaller than the width of the gate structure in conventionally fabricated LDMOS devices. In one embodiment, the depth of the first trench 206 may be in a range of about 0.4 μm to about 1.8 μm and the width of the first trench 206 may be in a range of about 0.2 μm to about 0.4 μm.

A sidewall surface of the formed first trench 206 coincides with a side surface of the remaining first shallow trench isolation structure 203. That is, the first trench 206 exposes the side surface of the remaining first shallow trench isolation structure 203. Another sidewall surface of the formed first trench 206 coincides with the surface of the top edge of the body region 201 and the portion of the semiconductor substrate 200 between the body region 201 and the drift region 202. That is, the first trench 206 exposes the surface of the top edge of the body region 201 and the portion of the semiconductor substrate 200 between the body region 201 and the drift region 202. After further forming a gate dielectric layer and a gate electrode, when the formed LDMOS device is at work, a conductive channel may be formed along the side surface and the bottom surface of the first trench 206 in the semiconductor substrate 200 between the body region 201 and the drift region 202.

Figure 4:
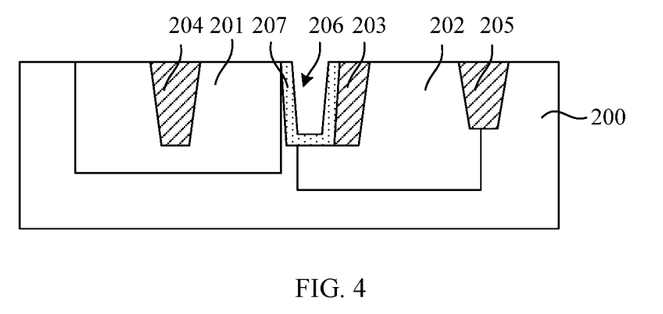

Returning to FIG. 8, further, a gate dielectric layer may be formed on the side surface and the bottom surface of the first trench (S203). FIG. 4 shows a schematic cross-section view of the corresponding semiconductor structure.

Referring to FIG. 4, the gate dielectric layer 207 is formed to cover the side surface and the bottom surface of the first trench 206. The gate dielectric layer 207 may be made of $SiO_x$ or any other appropriate material. The gate dielectric layer 207 may be fabricated by a thermal oxidation process or a chemical vapor deposition process. The thickness of the gate dielectric layer 207 may be in a range of about 120 nm to about 250 nm.

Figure 5:
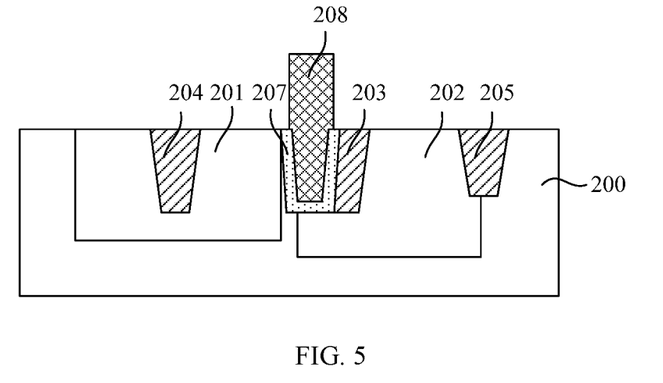

Further, referring to FIG. 8, a gate electrode may be formed on the gate dielectric layer (S204). FIG. 5 shows a schematic cross-section view of the corresponding semiconductor structure.

Referring to FIG. 5, the gate electrode 208 is formed on the surface of the gate dielectric layer 207. The gate electrode 208 fills the first trench 206 and the top surface of the gate electrode 208 may be higher than the surface of the semiconductor substrate 200.

The gate electrode 208 may be made of polycrystalline silicon or any other appropriate material.

In one embodiment, the gate electrode 208 may be formed by a process including: forming a gate electrode material layer to cover the surface of the semiconductor substrate 200 and the surface of the gate dielectric layer 207 with the gate electrode material layer filling up the first trench 206; forming a mask layer on the surface of the gate electrode material layer formed in the first trench 206 with the mask layer exposing the gate electrode material layer on both sides of the first trench 206; forming the gate electrode 208 on the gate dielectric layer 206 by etching a portion of the gate electrode material layer using the mask layer as an etch mask. The formed gate electrode 208 fills up the first trench 206 and the top surface of the gate electrode 208 may be higher than the surface of the semiconductor substrate 200.

In one embodiment, the formed gate electrode 208 and the gate dielectric layer 207 are located in the first trench 206 formed in the semiconductor substrate 200, thus when the formed LDMOS device is at work, a vertical conductive channel may be formed on the side surface and the bottom surface of the first trench in the semiconductor substrate 200. Therefore, with a same breakdown voltage, the width of the gate structure in the formed LDMOS device may be sufficiently small, and the width of the LDMOS device along the horizontal direction may be reduced.

Returning to FIG. 8, further, sidewall spacers may be formed on both side surfaces of the portion of the gate electrode above the surface of the semiconductor substrate (S205). FIG. 6 shows a schematic cross-section view of the corresponding semiconductor structure.

Referring to FIG. 6, sidewall spacers are formed on both side surfaces of the portion of the gate electrode 208 that is above the surface of the semiconductor substrate 200. In a subsequent ion implantation process, the sidewall spacers may provide protection for the gate electrode 208. In addition, the sidewall spacers may also be used to adjust the position of the source region in the body region 201 during the subsequent ion implantation process. Specifically, the thickness of the sidewall spacers may define the edge of the source region formed in the body region 201.

The sidewalls may have a single-layer structure or a multiple-layer structure (e.g., having two or more layers). The sidewall spacers may be made of $SiO_x$, $SiN_x$, or any other gas etching material.

In one embodiment, the formation of the sidewall spacers may include forming a sidewall material layer to cover the surface of the semiconductor substrate 200 and the surface of the gate electrode 208, then forming the sidewall spacers on the side surfaces of the gate electrode 208 by etching the sidewall material layer without using any mask.

Further, referring to FIG. 8, a source region may be formed in the body region on the side close to the gate electrode and a drain region may be formed in the drift region located on the other side of the gate electrode (S206). FIG. 7 shows a schematic cross-section view of the corresponding semiconductor structure.

Referring to FIG. 7, the source region 211 is formed in the body region 201 on the side close to the gate electrode 208. The drain region 210 is formed in the drift region 202 located on the other side of the gate electrode 208.

The source region 211 and the drain region 210 may be formed by an ion implantation process. The type of the ions doped into the source region 211 is the same type of the ions doped into the drain region 210. Specifically, when the LDMOS device to be formed is N-type, the source region 211 and the drain region 210 are both N-type doped; while when the LDMOS device to be formed is P-type, the source region 211 and the drain region 210 are both P-type doped.

When the source region 211 and the drain region 210 are N-type doped, the N-type impurity ions may be one or more of phosphorus ions, arsenic ions, and antimony ions. The energy used to implant ions may be in a range of about 600 keV to about 2000 keV and the implantation dose may be in a range of about 1E12 atom/cm$^3$ to about 5E12 atom/cm$^3$.

When the source region 211 and the drain region 210 are P-type doped the N-type impurity ions may be one or more of boron ions, indium ions, and gallium ions. The energy used to implant ions may be in a range of about 20 keV to about 600 keV and the implantation dose may be in a range of about 1E12 atom/cm$^3$ to about 2E13 atom/cm$^3$.

Further, a first doped region may also be formed in the body region on the side of the third shallow trench isolation structure opposite to the source region. Referring to FIG. 7, the first doped region 213 is formed in the body region 201 near the third shallow trench isolation structure 204. The first doped region 213 may be formed on the side of the third shallow trench isolation structure 204 opposite to the side having the source region 211 formed in a previous process. The doping type of the first doped region 213 may be the same as the doping type of the body region 201.

When an LDMOS device formed in the present disclosure is at work, a current conduction channel may be formed in the source region 211, the semiconductor substrate 200 on the side and the bottom surfaces of the first trench, the drift region 202 in the bottom of the first trench, the bottom of the remaining first shallow trench isolation structure 203 between the drift region 202 and the drain region 210.

The present disclosure also includes an LDMOS device. Referring to FIG. 7, the exemplary LDMOS device includes a semiconductor substrate 200. A drift region 202 and a body region 201 adjacent to the drift region 202 are formed in the semiconductor substrate 200. A first shallow trench isolation structure 203 is formed in the drift region 202.

The LDMOS device may also include a first trench. The first trench may be formed in the drift region 202 on one side of the first trench isolation structure 203 and also in the semiconductor substrate 200 between the drift region 202 and the body region 201.

The LDMOS device may further include a gate dielectric layer 207 formed on the side and the bottom surfaces of the first trench.

Further, the LDMOS device may include a gate electrode 208. The gate electrode 208 may be formed on the surface of the gate dielectric layer 207 and may fill up the first trench. The top surface of the gate electrode 208 may be higher than the surface of the semiconductor substrate 200.

In addition, the LDMOS device may also include a source region 211 formed in the body region 201 on one side of the gate electrode 208 and a drain region 210 formed in the drift region 202 on the other side of the gate electrode 208.

In one embodiment, one side of the first trench exposes a side surface of the first shallow trench isolation structure 203 while the other side of the first trench exposes the top edge surface of the body region 201 and a portion of the semiconductor substrate 200 between the body region 201 and the drift region 202.

The width of the first trench may decrease from the top of the trench to the bottom of the trench.

The width of the first trench may be in a range of about 0.2 µm to about 0.4 µm and the depth of the first trench may be in a range of about 0.4 µm to about 1.8 µm.

The LDMOS device may be an N-type LDMOS device or a P-type LDMOS device.

Compared to conventionally fabricated LDMOS devices, the disclosed LDMOS devices may demonstrate a number of advantages.

First, the disclosed LDMOS device includes a first trench formed in the drift region next to the first shallow trench isolation structure and also in the semiconductor substrate between the drift region and the body region, a gate dielectric layer covering the side and the bottom surfaces of the first trench, a gate electrode formed on the gate dielectric layer and filling up the first trench, and a source region in the body region on one side of the gate electrode and a drain region in the drift region on the other side of the gate electrode next to the first shallow trench isolation structure. The top surface of the gate electrode is above the surface of the semiconductor substrate. When the LDMOS device is at work, a vertical conductive channel may be formed on the side surface and the bottom surface of the first trench in the semiconductor substrate. Therefore, with a same breakdown voltage, the width of the gate structure in the disclosed LDMOS device may be sufficiently small as compared to the width of the gate structure in devices fabricated by conventional methods, thus the width of the LDMOS device along the horizontal direction may be reduced.

Further, the width of the first trench is in a range of about 0.2 µm to about 0.4 µm and the depth of the first trench is in a range of about 0.4 µm to about 1.8 µm. As a result, the width of the formed gate dielectric layer and the gate electrode is also in the range of about 0.2 to about 0.4 µm. A relatively small width of the gate dielectric layer and the gate electrode formed in the first trench may improve the degree of device integration.

Further, the disclosed method for fabricating the LDMOS device includes forming a first trench in the drift region on the same side of the remaining portion of the first shallow trench isolation structure and also in the semiconductor substrate of the region between the drift region and the body region; then, forming a gate dielectric layer on the side surface and the bottom surface of the first trench; forming a gate electrode on the top of the gate dielectric layer with the gate electrode filling up the first trench while the top surface of the gate electric higher than the surface of the semiconductor substrate; forming a source region in the body region on the same side of the gate electrode and also forming a drain region in the drift region on the other side of the gate electrode next to the remaining first shallow trench isolation structure. The first trench is formed by removing a portion of the first shallow trench isolation structure through etching. Because the material used for the first shallow trench isolation structure and the material of the semiconductor substrate are different and during the etching process, the ratio between the etching rate on the material for the first shallow trench isolation structure and the etching rate on the material of the semiconductor substrate is sufficiently large, the portion of the semiconductor substrate in contact with the first shallow trench isolation structure may serve as an etching stop layer. Therefore, the position precision of the formed first trench may be improved and the difficulty in forming the first trench 206 may also be reduced.

In addition, according to the disclosed method for fabricating the LDMOS device, the gate dielectric layer and the gate electrode are located in the first trench. When the LDMOS device is at work, a vertical conductive channel may be formed on the side surface and the bottom surface of the first trench in the semiconductor substrate. Therefore, with a same breakdown voltage, the width of the gate structure in the LDMOS device may be sufficiently small, and the width of the LDMOS device along the horizontal direction may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a lateral double-diffused MOSFET (LDMOS) device, comprising:
    forming a drift region and a body region in a semiconductor substrate;
    forming a first shallow trench isolation structure in the drift region and in the semiconductor substrate between the drift region and the body region;
    removing a portion of the first shallow trench isolation structure to provide a first trench having a first portion in the semiconductor substrate between the drift region and the body region and a second portion in the drift region next to a remaining portion of the first shallow trench isolation structure, a side surface of the first trench being connected to a top surface of the body region;
    forming a gate dielectric layer on a side surface and a bottom surface of the first trench;
    forming a gate electrode on the gate dielectric layer and filling up the first trench to provide a top surface above a top surface of the semiconductor substrate;
    forming a first sidewall spacer and a second sidewall spacer on both side surfaces of the gate electrode, the first sidewall spacer being on a portion of the gate dielectric layer and a portion of the body region and the second sidewall spacer being on another portion of the gate dielectric layer and a portion of the first shallow trench isolation structure; and
    forming a source region in the body region on one side of the gate electrode and a drain region in the drift region on another side of the gate electrode.

2. The method for fabricating the LDMOS device according to claim 1, wherein:
    a depth of the first trench equals to a depth of the first shallow trench isolation structure.

3. The method for fabricating the LDMOS device according to claim 1, wherein:

a width of the first shallow trench isolation structure is in a range of about 0.4 µm to about 0.8 µm;
a width of the first trench is in a range of about 0.2 µm to about 0.4 µm; and
a depth of the first shallow trench isolation structure and a depth of the first trench are both in a range of about 0.4 µm to about 1.8 µm.

4. The method for fabricating the LDMOS device according to claim 1, wherein:
a width of the first shallow trench isolation structure gradually decreases from top to bottom; and
a top edge of the first shallow trench isolation structure is in contact with a top edge of the body region.

5. A method for fabricating a lateral double-diffused MOSFET (LDMOS) device, comprising:
forming a drift region and a body region in a semiconductor substrate;
forming a first shallow trench isolation structure in the drift region and in the semiconductor substrate between the drift region and the body region;
removing a portion of the first shallow trench isolation structure to provide a first trench having a first portion in the semiconductor substrate between the drift region and the body region and a second portion in the drift region next to a remaining portion of the first shallow trench isolation structure;
forming a gate dielectric layer on a side surface and a bottom surface of the first trench;
forming a gate electrode on the gate dielectric layer and filling up the first trench to provide a top surface above a top surface of the semiconductor substrate; and
forming a source region in the body region on one side of the gate electrode and a drain region in the drift region on another side of the gate electrode, wherein a width of the first shallow trench isolation structure gradually decreases from top to bottom, a top edge of the first shallow trench isolation structure is in contact with a top edge of the body region, and one side of the first trench exposes a side surface of the remaining portion of the first shallow trench isolation structure and another side of the first trench exposes a surface of the top edge of the body region and a portion of the semiconductor substrate between the body region and the drift region.

6. The method for fabricating the LDMOS device according to claim 5, prior to forming the source region and the drain region, further including:
forming sidewall spacers on both side surfaces of the gate electrode above the top surface of the semiconductor substrate.

7. The method for fabricating the LDMOS device according to claim 1, wherein:
the step of removing the portion of the first shallow trench isolation structure to provide the first trench includes an anisotropic dry etching process.

8. The method for fabricating the LDMOS device according to claim 1, wherein:
the gate dielectric layer is made of $SiO_x$.

9. The method for fabricating the LDMOS device according to claim 8, wherein:
the gate dielectric layer is formed by a thermal oxidation process.

10. The method for fabricating the LDMOS device according to claim 8, wherein:
the gate dielectric layer is formed by a chemical vapor deposition process.

11. The method for fabricating the LDMOS device according to claim 8, wherein:
a thickness of the gate dielectric layer is in a range of about 120 nm to about 250 nm.

12. The method for fabricating the LDMOS device according to claim 1, wherein:
the gate electrode is made of polycrystalline silicon.

13. The method for fabricating the LDMOS device according to claim 1, wherein forming the gate electrode further includes:
forming a gate electrode material layer to cover the top surfaces of the semiconductor substrate and the gate dielectric layer and to fill up the first trench;
forming a mask layer on the gate electrode material layer; and
forming the gate electrode on the gate dielectric layer by etching a portion of the gate electrode material layer using the mask layer as an etch mask.

14. The method for fabricating the LDMOS device according to claim 1, wherein:
each of the body region, the drift region, the source region, and the drain region is formed by an ion implantation process;
the body region and the drift region are doped with different types of ion impurities; and
the drift region, the source region, and the drain region are doped with a same type of ion impurities.

15. The method for fabricating the LDMOS device according to claim 1, wherein a portion of the semiconductor substrate is located between the side surface of the first trench and body region.

16. The method for fabricating the LDMOS device according to claim 1, wherein a width of the first trench is larger than a width of the gate electrode.

17. The method for fabricating the LDMOS device according to claim 5, wherein a depth of the first trench equals to a depth of the first shallow trench isolation structure.

* * * * *